(12) United States Patent
Ludwig

(10) Patent No.: US 6,202,860 B1
(45) Date of Patent: Mar. 20, 2001

(54) ELECTRONIC EQUIPMENT ENCLOSURE

(75) Inventor: John R. Ludwig, Edmond, OK (US)

(73) Assignee: W. H. Stewart Co.

( * ) Notice: Subject to any disclaimer, the term of this patent is extended or adjusted under 35 U.S.C. 154(b) by 0 days.

(21) Appl. No.: 09/413,994

(22) Filed: Oct. 7, 1999

(51) Int. Cl.$^7$ ...................................................... A47F 5/00
(52) U.S. Cl. ............................ 211/26; 211/189; 361/829; 312/265.4
(58) Field of Search .............................. 211/26, 189, 182, 211/187; 361/829; 312/265.1, 265.2, 265.3, 265.4, 265.5

(56) References Cited

U.S. PATENT DOCUMENTS

| | | | |
|---|---|---|---|
| 2,959,715 | * 11/1960 | Leonchick . | |
| 4,274,547 | * 6/1981 | Takagi et al. . | |
| 4,691,644 | * 9/1987 | Frydman | 108/111 |
| 4,899,892 | 2/1990 | Rheault | 211/41 |
| 5,372,262 | * 12/1994 | Benson et al. | 211/26 |
| 5,378,057 | * 1/1995 | Bach et al. | 312/257.1 |
| 5,383,723 | 1/1995 | Meyer | 312/265.4 |
| 5,807,008 | * 9/1998 | Schwenk et al. | 312/265.1 X |
| 5,979,672 | * 11/1999 | Gemra et al. | 211/26 |
| 6,006,925 | * 12/1999 | Sevier | 211/26 |
| 6,065,724 | * 5/2000 | Arslan et al. | 211/187 X |

OTHER PUBLICATIONS

"Associated Products": Hendry Telephone Products, Manufacturer's Catalogue, 02/98(pp. 8 & 9).

"Indoor Cabinets": Hendry Telephone Products, Manufacturer's Catalogue, 03/98 (pp. 7 & 8).

"Announcement of a New Electronic Equipment Enclosure", Digest of Technical Information—Licensing Agreement Negotiated with W.H. Stewart Co. for Bellcore Electronic Equipment Enclosure, Dec. 1997, (pp. 5 & 6).

Pending U.S. Patent Application 08/630,304; Title: "Earthquake Resistant Enclosure for Electronic Equipment"; Filing Date: Apr. 10, 1996; Inventors: Gemra et al.

* cited by examiner

Primary Examiner—Robert W. Gibson, Jr.
(74) Attorney, Agent, or Firm—Dunlap, Codding & Rogers, P.C.

(57) ABSTRACT

An electronic equipment enclosure for supporting a plurality of shelves is provided. The enclosure includes a frame having an opposed pair of upstanding, corrugated panels separated by a top and bottom corrugated panel together defining a shelf receiving cavity. The enclosure further includes a pair of mounting bracket assemblies removably attached to the upstanding panels of the frame in an opposing relationship. Each mounting bracket assembly has a set of apertures alignable with corresponding mounting apertures of the shelves to facilitate attachment of the shelves to the frame.

25 Claims, 8 Drawing Sheets

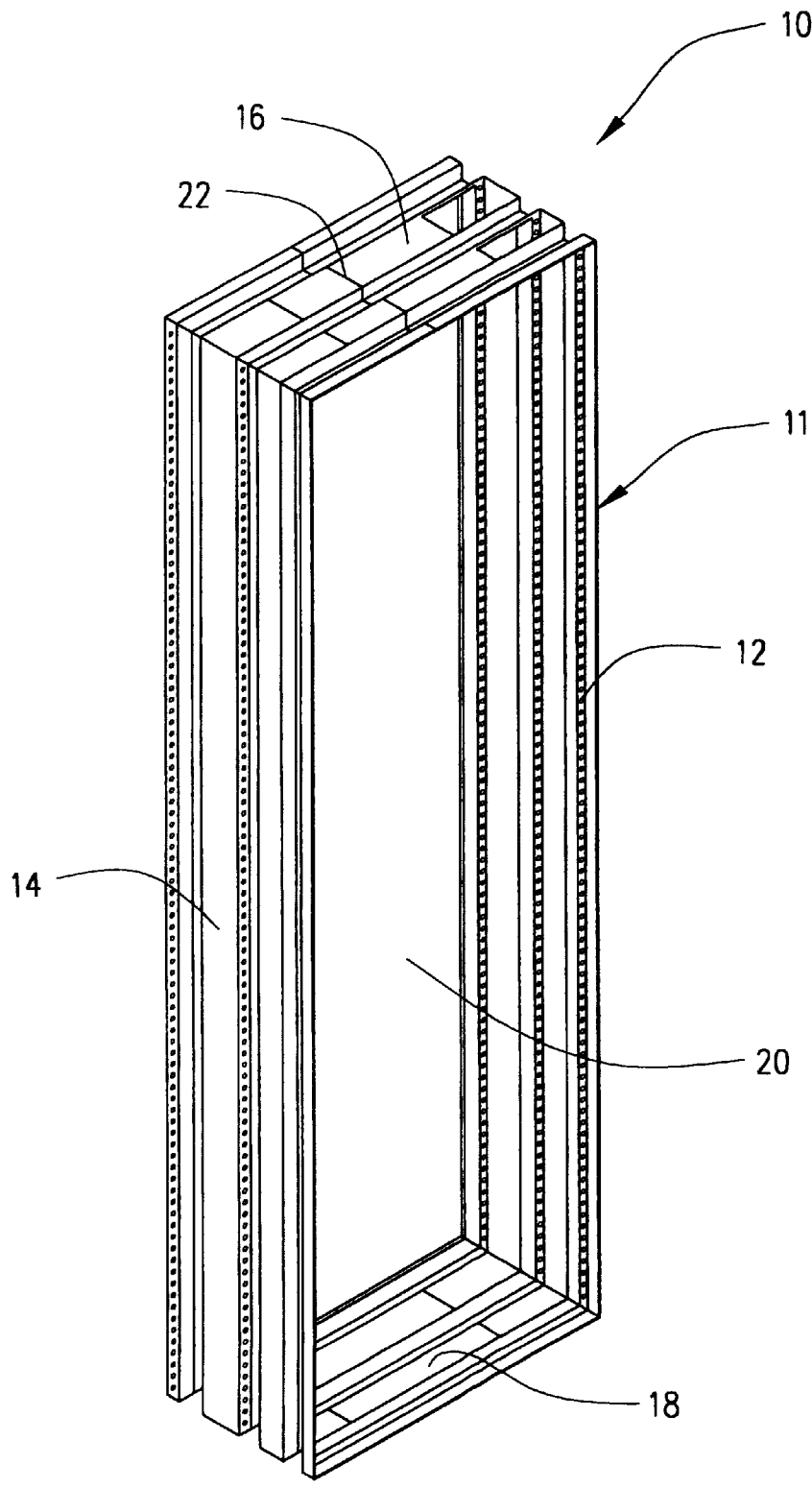
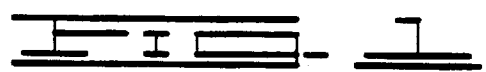
PRIOR ART

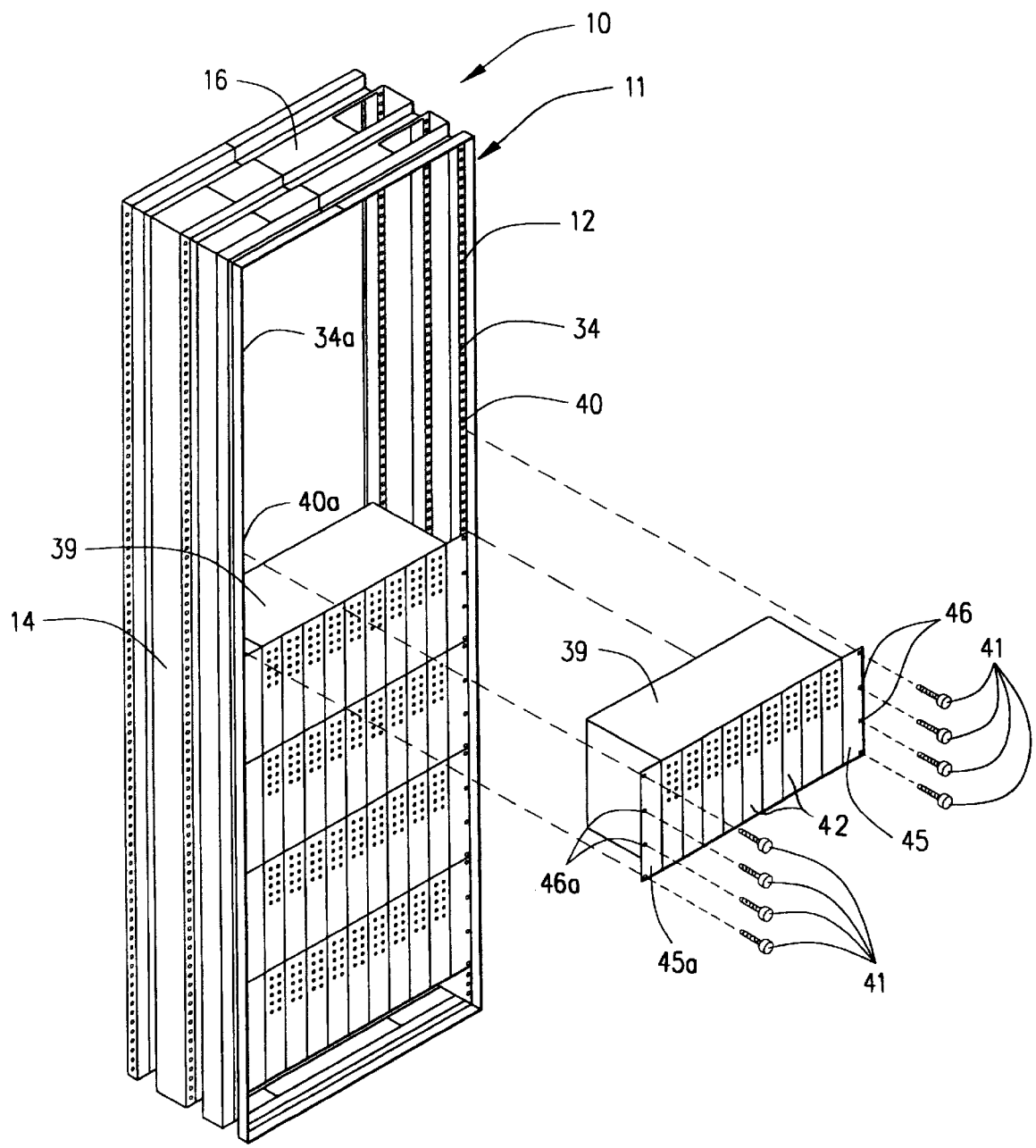
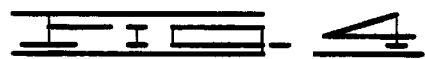
PRIOR ART

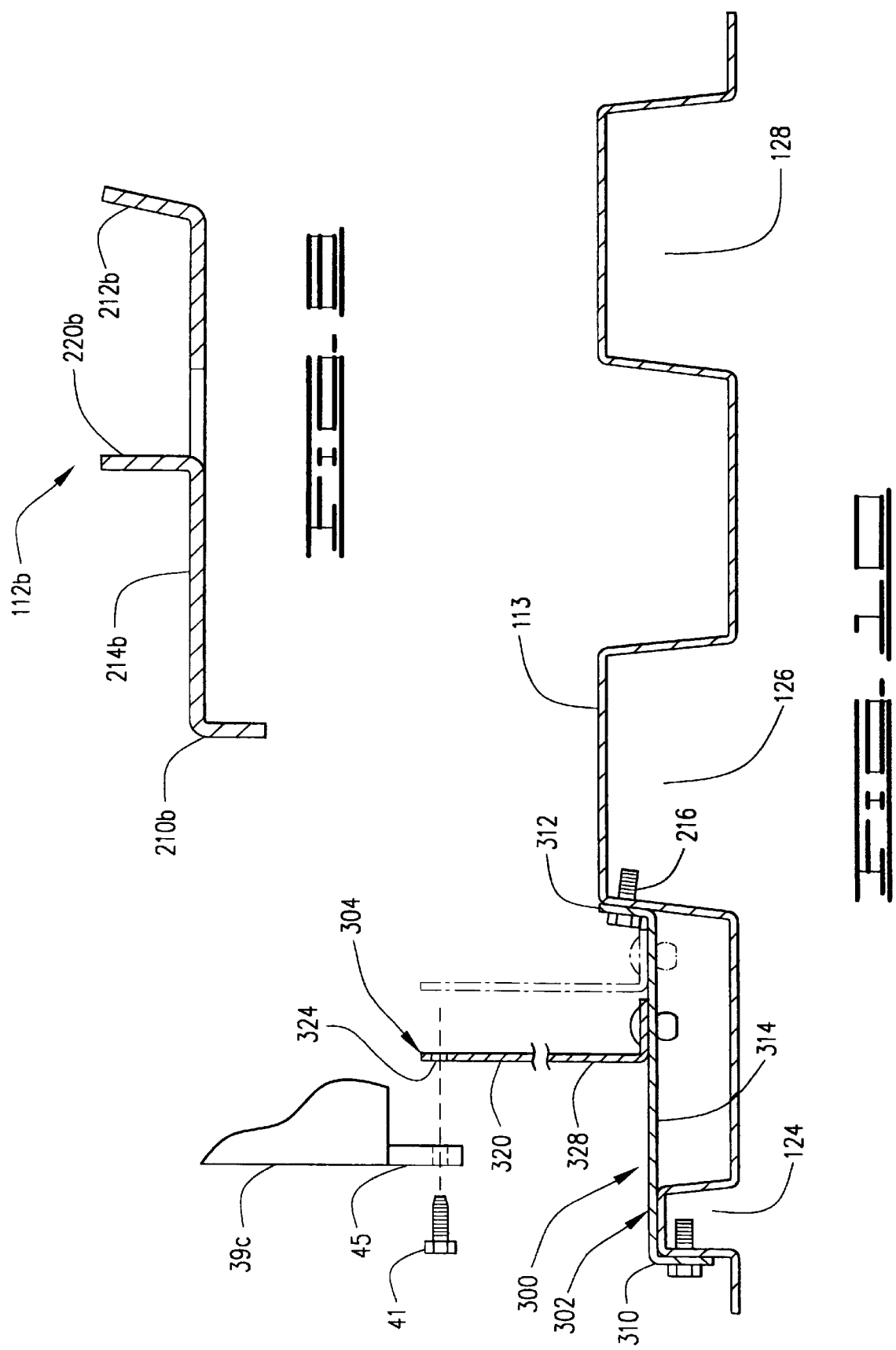

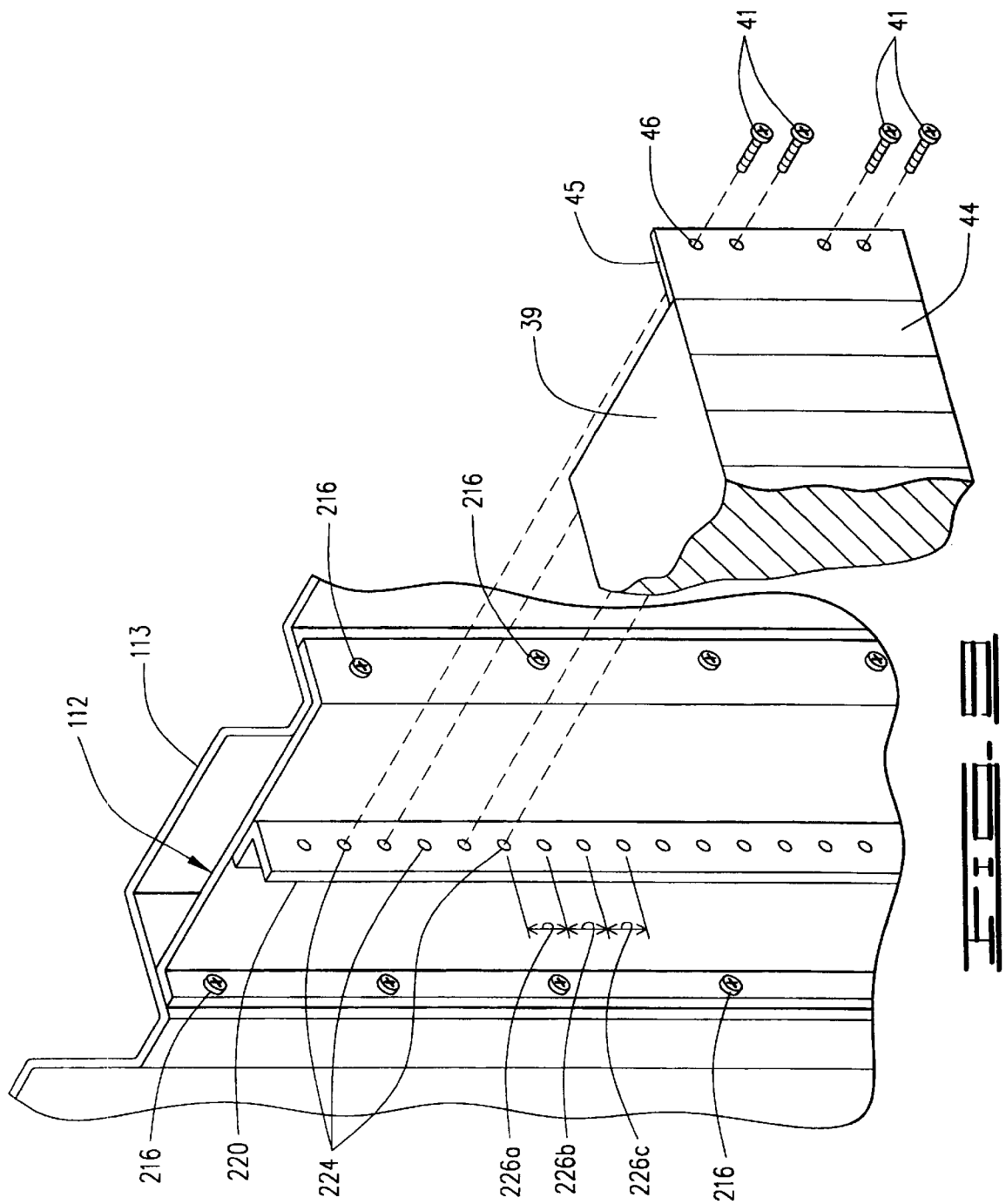

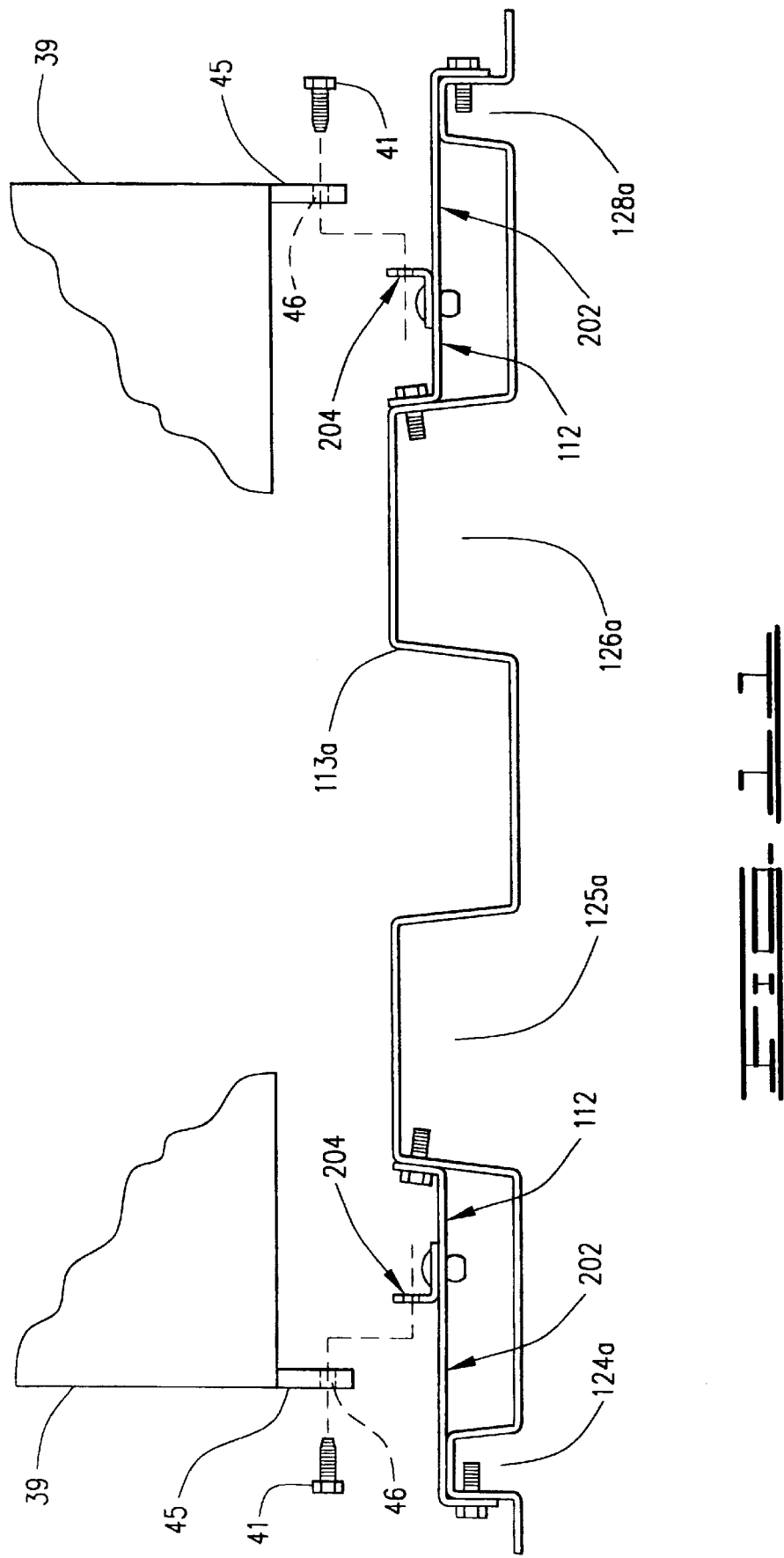

ELECTRONIC EQUIPMENT ENCLOSURE

BACKGROUND OF THE INVENTION

1. Field of the Invention

The present invention relates generally to the field of electronic equipment enclosures, and more particularly, but not by way of limitation, to a modular electronic equipment enclosure including a frame and interchangeable bracket assembly sets for supporting electronic equipment components having various mounting characteristics.

2. Brief Description of Related Art

Electronic equipment enclosures are widely used to support and to enclose electronic equipment such as relays, computer components, switching gear, and the like. Generally, the enclosures have an upstanding frame provided with mounting holes for the attachment of shelf members that, in turn, support the electronic equipment. The frame typically defines a central shelf receiving cavity into which the shelves are disposed, and panels or doors are often supported on the frame to provide an enclosure cabinet.

The frame is designed to withstand external forces to protect the electronic equipment from damage. The most rigorous frames are designed to withstand earthquake-level forces. The required structural integrity is often achieved by the use of structural bracing members. However, a frame having a corrugated sheet metal construction has recently been proposed. Cross-sectional strengthening flanges impart the desired strength to the frame, thereby eliminating the need for bracing members.

The corrugated frame has opposing pairs of upstanding support members, each provided with a pattern of apertures for securing shelves to the interior of the frame. The frame is thereby limited to a particular aperture pattern. Consequently, the shelves secured to the frame are restricted to being of a particular size and having a particular mounting hole pattern that will matingly align with the aperture pattern of the frame.

A specific pattern of apertures in the frame is suitable where the mounting hole pattern of the shelves correspond with the apertures of the frame. However, if a shelf having a different aperture pattern is specified, or is more readily available, a frame having the corresponding aperture pattern is required to be constructed. In that numerous types of shelves are available, having to provide a frame with an aperture pattern for every different type of shelf significantly increases manufacturing costs.

To this end, a need exists for a modular electronic equipment enclosure having a frame and interchangeable bracket assembly sets for supporting shelves having various mounting characteristics. It is to such an apparatus that the present invention is directed.

BRIEF SUMMARY OF THE INVENTION

The present invention provides a modular electronic equipment enclosure for the installation of electronic equipment shelves having various mounting characteristics. Shelves with different mounting characteristics such as different mounting hole patterns and different widths, as well as shelves mounted at different depths can be simultaneously installed into the enclosure.

The enclosure has a frame supporting a mounting bracket assembly set comprising opposed pairs of mounting bracket assemblies which support both ends of a shelf. The mounting bracket assemblies have mounting flanges which provide an abutting surface for a pressing engagement with a mounting portion of each end of the shelf, the mounting flanges furthermore having spaced apertures which align with a mounting hole pattern of the shelf mounting portions. The mounting flanges are supported by mounting brackets of the mounting bracket assemblies, the mounting brackets being removably attached to the frame.

The adaptability of the enclosure to support shelves having particular mounting characteristics is thus provided by removably attached mounting bracket assembly sets. If a shelf having different mounting characteristics is desired for use in the enclosure, an existing mounting bracket assembly set can be readily replaced with a different mounting bracket assembly set without modifying or replacing the frame of the enclosure. This arrangement provides flexibility and cost reduction associated with the task of specifying new or replacing existing electronic equipment for use in the enclosure. These and various other features as well as advantages which characterize the present invention will be apparent upon reading the following detailed description and review of the associated drawings.

BRIEF DESCRIPTION OF THE SEVERAL VIEWS OF THE DRAWINGS

FIG. 1 is an isometric view of a prior art electronic equipment enclosure having a corrugated sheet metal frame construction.

FIG. 4 is a partially exploded, isometric view of the prior art enclosure of FIG. 1 illustrating the operative support of a plurality of shelves.

FIG. 6 is a partially cutaway, isometric view of an electronic equipment enclosure constructed in accordance with the present invention.

FIG. 8 is a sectional view of another mounting bracket assembly constructed in accordance with the present invention.

FIG. 9 is a partially exploded, isometric view of a portion of the electronic equipment enclosure of FIG. 6 illustrating one end of a shelf being connected to a mounting bracket assembly of the electronic equipment enclosure.

FIG. 10 is a sectional view of a portion of the electronic equipment enclosure of FIG. 6 illustrating a shelf having a different width being connected to another mounting bracket assembly constructed in accordance with the present invention.

FIG. 11 is a sectional view of a portion of an alternative electronic equipment enclosure illustrating a pair of shelves being connected to mounting bracket assemblies in a back-to-back relationship in accordance with the present invention.

DETAILED DESCRIPTION OF THE INVENTION

Figure 2:
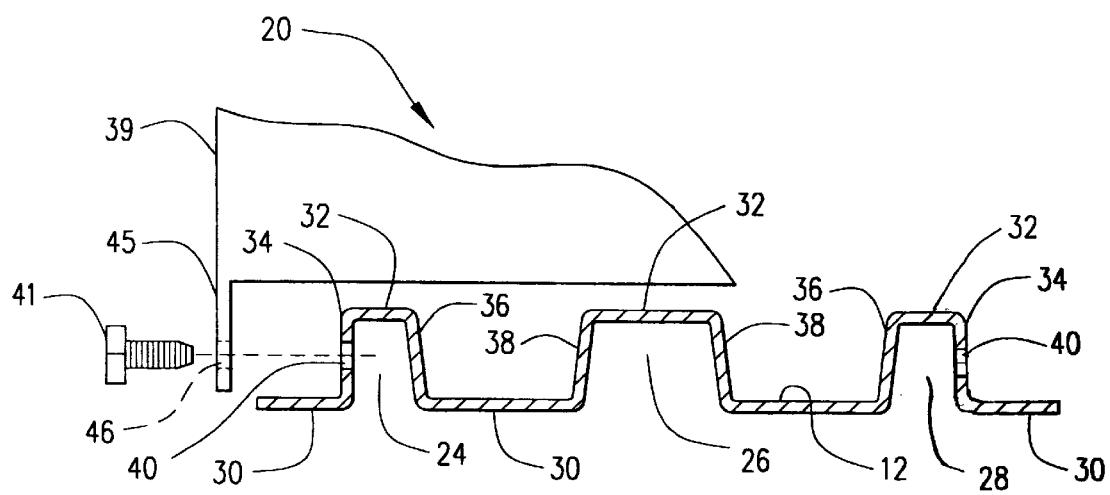
FIG. 2 is a diagrammatic sectional view of a corrugated side panel of the prior art enclosure of FIG. 1 and a plan view of a portion of one end of an electronic equipment shelf illustrating the manner in which the shelf is attached to the side panel.

The present invention provides for selectively installing electronic equipment shelves having various mounting characteristics into an electronic equipment enclosure. In setting forth the present invention, it will be helpful to first describe a representative prior art enclosure, followed by a description of an improved enclosure built in accordance with the present invention.

Turning now to the drawings, and in particular to FIG. 1, a prior art enclosure 10 is illustrated. The enclosure 10 includes a frame 11 formed of opposing side panels 12, 14 joined to a top panel 16 and a base panel 18. The panels 12, 14, 16, 18 define a shelf receiving cavity 20 into which electronic equipment is operatively disposed.

The enclosure 10 of FIG. 1 is illustrative of one type of enclosure that is resistant to earthquake level forces without the need for structural bracing within the shelf receiving cavity 20. The desired structural integrity is achieved by forming the side panels 12, 14 and the top and base panels 16, 18 of a material having longitudinal flanges forming strengthening corrugations. The frame 11 can be formed unitarily wherein a single sheet of corrugated material is formed into a rectangular configuration, the ends being joined such as by welding at a single joint 22 as shown in FIG. 1. Alternatively, the panels 12, 14, 16, 18 can be provided as discrete components that are joined at the corners. Doors and backing panels (not shown) can be attached to the panels 12, 14, 16, 18 to enclose the shelf receiving cavity 20 in order to provide an enclosure cabinet.

FIG. 2 is a diagrammatic sectional view of the corrugated side panel 12 of the frame 11, illustrating one suitable configuration of the corrugations. The corrugated side panel 12 is preferably made of a thin steel, such as 12-gauge sheet steel, and is shown to include a plurality of corrugations 24, 26, 28. The corrugations are formed in a manner well known in the metal forming art such as, but not limited to, braking, stamping or roll-forming operations. The number of corrugations in the side panel 12 will depend in part on the desired depth of the shelf receiving cavity 20 and on the desired strength of the enclosure 10. The depth of the shelf receiving cavity 20 is substantially determined by the width of the panels 12, 14, 16, 18. In the illustrative embodiment of FIG. 2, a width of about 450 millimeters is illustrated with the interior corrugation (corrugation 26) formed about 50 millimeters wide at a base portion thereof and the exterior corrugations (corrugations 24 and 28) formed about 40 millimeters wide at base portions thereof. The corrugations 24, 26, 28 are formed to have a height of about 48 millimeters. The corrugation arrangement of FIG. 2 has planar portions 30 which are substantially unchanged from the characteristics of the flat sheet steel prior to forming the corrugations 24, 26, 28. A top flange 32 of each corrugation 24, 26, 28 is substantially parallel to the planar portions 30. The exterior corrugations 24, 28 have outer-facing flanges 34 that are substantially orthogonal to the planar portions 30, and inner-facing flanges 36 that slope away from the outer-facing flanges 34 in traversing from the top flange 32 to the planar portion 30. The interior corrugation 26 has substantially equilaterally sloping opposing flanges 38 forming a broader base adjacent the planar portions 30 than adjacent the corresponding top flange 32.

The outer-facing flange 34 of the corrugation 24 provides a supporting surface for attachment of an electronic equipment shelf 39 (one side shown in FIG. 2). Apertures 40 are provided in the outer-facing flange 34 of the corrugation 24 for receiving engagement of a plurality of fasteners 41 (one shown in FIG. 2) for attaching the shelf 39 to the side panel 12. The opposing side of the shelf 39 is attached to the side panel 14 in like manner.

The manner in which each aperture 40 cooperates with the fastener 41 in attaching the shelf 39 can be any of a number of conventional methods of mechanical fastening, such as, but not limited to, riveting or threadingly joining the fastener 41 and aperture 40. In a threading engagement, the aperture 40 can be a clearance hole through which a threaded fastener passes and is retained by a capture nut (not shown) positioned within the corrugation 24. Alternatively, the aperture 40 can be an engagement hole that is threaded or is appropriately sized for a thread-forming fastener.

Figure 3:
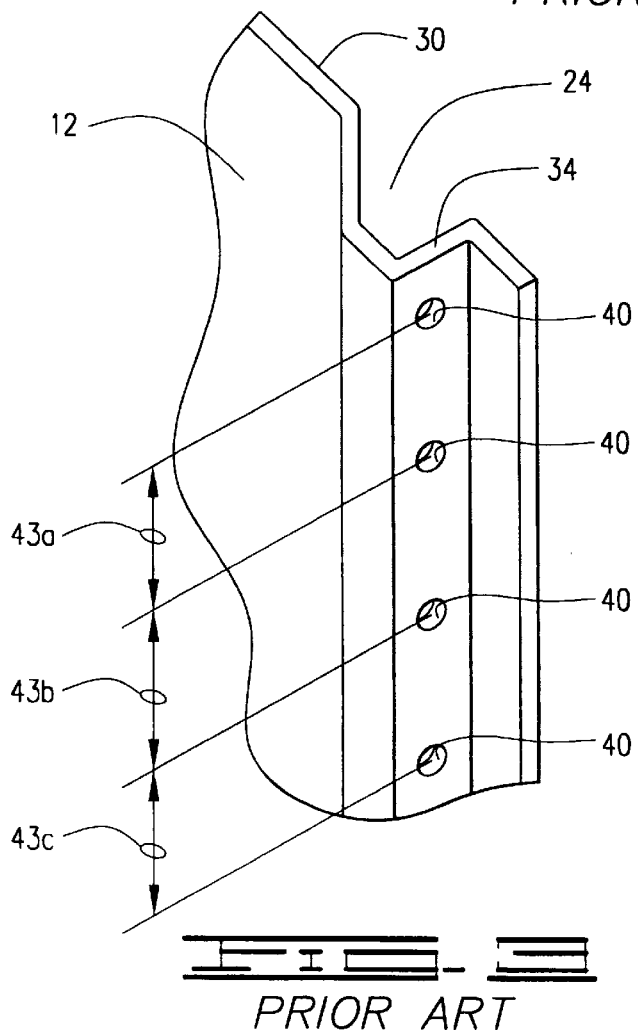
FIG. 3 is a partial isometric view of the corrugated side panel of FIG. 2.

FIG. 3 is a partial isometric view of the side panel 12, showing the arrangement of the apertures 40 along the outer-facing flange 34 of the corrugation 24. The apertures 40 are substantially centered along a common vertical axis at preselected center-to-center spacings denoted by the reference numerals 43a, 43b, 43c.

FIG. 4 is an isometric view illustrating the manner in which the shelves 39 are supported by the outer-facing flange 34 of the side panel 12, and in a like manner by the opposing side panel 14. A plurality of electronic equipment components 42 are individually supported within the shelf 39 which is, in turn, attached to the side panels 12, 14 by the plurality of fasteners 41 that pass through attaching flanges 45, 45a of the shelf 39 to engage the apertures 40, 40a of the outer-facing flange 34, 34a of side panels 12, 14, respectively.

Figure 5:
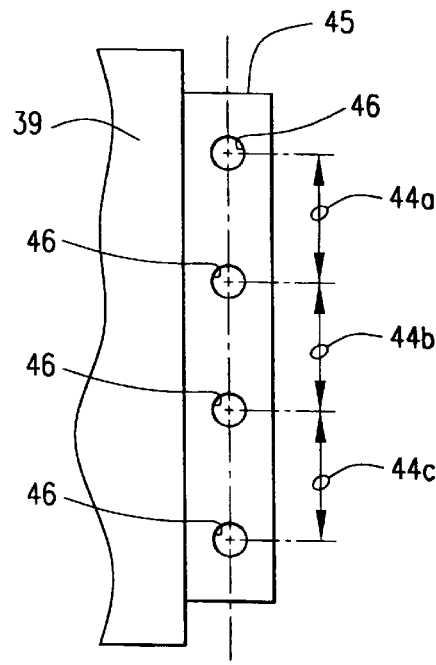
FIG. 5 is a partial elevational view of a prior art shelf showing the attaching flange on one end of the shelf and the associated mounting hole pattern in the attaching flange for attaching the shelf to the enclosure.
Figure 5:
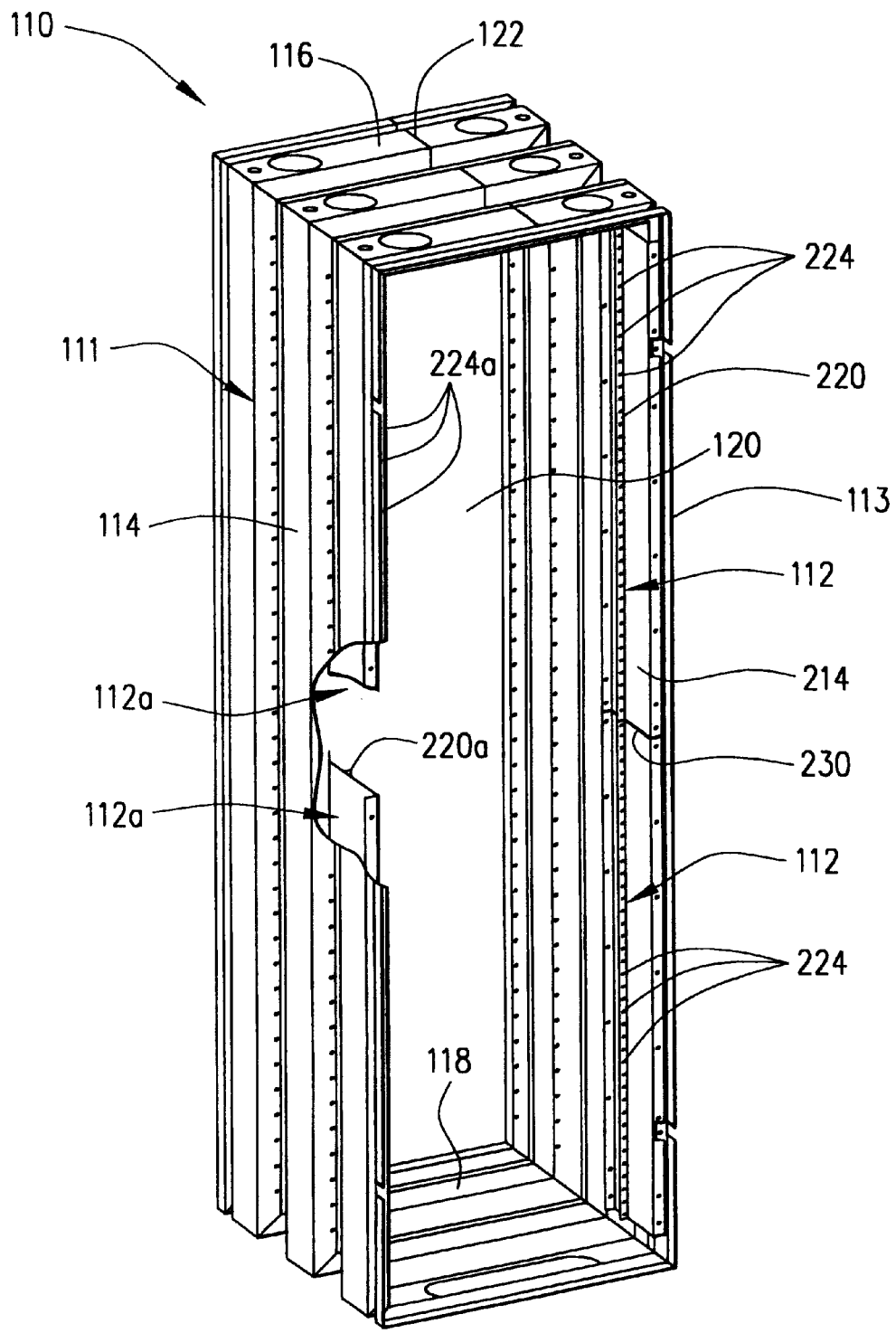

FIG. 5 is an elevational view of the attaching flange 45 on one end of the shelf 39, illustrating for example, a mounting pattern of four holes 46 through which the fasteners 41 (FIGS. 2 and 4) pass in attaching the shelf 39 to the side panel 12 as previously described. It will be noted the holes 46 are substantially centered along a common vertical axis at preselected center-to-center spacings denoted by the reference numerals 44a, 44b, 44c. If the center-to-center spacings 44 of holes 46 are equivalent to or an integer-multiple of the center-to-center spacings 43 of the apertures 40 (see FIG. 3), then the enclosure 10 is readily adaptable for receivingly supporting the shelf 39 because the holes 46 of the shelf 39 align with the apertures 40 of the side panel 12, thus providing for a joining passage of the fasteners 41. Although not shown, it should be understood this alignment of the mounting hole pattern of the other end of the shelf 39 and the apertures 40a (see FIG. 4) is likewise necessary for attachment of the shelf 39 to the opposing side panel 14.

From the previous discussion, and as best illustrated in FIGS. 3 and 4, the frame 11 has a pattern of apertures 40, 40a formed directly on a portion of the side panels 12, 14. Thus, the pattern of apertures 40, 40a in the side panels 12, 14 is limited to a preselected pattern. The disadvantage is that a fixed pattern of apertures 40, 40a in the side panels 12, 14 limits the types of shelves 39 that can be installed in the frame 11. In other words, the use of a different shelf 39 may require the construction and installation of an entirely different frame 11.

Referring now to FIG. 6, an enclosure 110 constructed in accordance with the present invention is illustrated. The enclosure 110 includes a frame 111 and a pair of mounting bracket assemblies 112 and 112a. The frame 111 is formed of opposing side panels 113, 114 joined to a top panel 116 and a base panel 118. The panels 113, 114, 116, 118 define a shelf receiving cavity 120 into which electronic equipment is operatively disposed.

In a similar manner to the prior art frame 11, the frame 111 of FIG. 6 is resistant to earthquake level forces without the need for structural bracing within the shelf receiving cavity 120. The desired structural integrity is achieved by forming the side panels 113, 114 and the top and base panels 116, 118 of a material having longitudinal flanges forming strengthening corrugations. The frame 111 can be formed unitarily wherein a single sheet of corrugated material is formed into a rectangular configuration, the ends being joined such as by welding at a single joint 122 as shown in FIG. 1. Alternatively, the panels 113, 114, 116, 118 can be provided as discrete components that are joined at the corners. Doors and backing panels (not shown) can be attached to the panels 113, 114, 116, 118 to enclose the shelf receiving cavity 120 in order to provide an enclosure cabinet.

Figure 7:
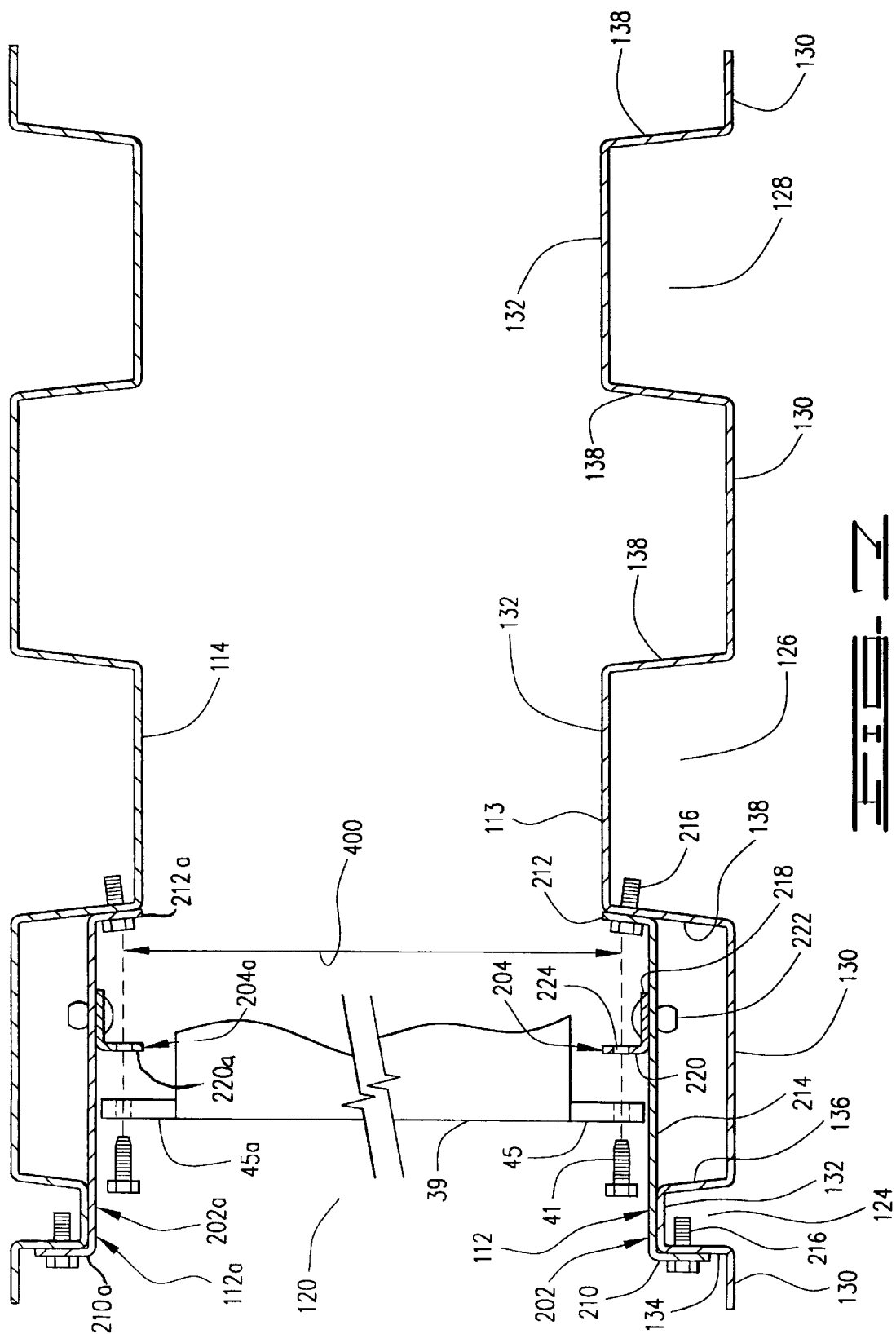
FIG. 7 is a sectional view of the enclosure of FIG. 6 illustrating a shelf being connected at both ends to a bracket assembly set.

FIG. 7 is a diagrammatic sectional view of the corrugated side panels 113, 114 of the frame 111, illustrating one suitable configuration of the corrugations. The side panel 114 is a mirror image of the side panel 113 and as such is constructed and functions substantially in the same manner. The following discussion is limited to a detailed description of side panel 113 which in effect encompasses the opposing side panel 114 such that a separate detailed description thereof is not necessary for an understanding of the present invention.

The corrugated side panel 113 is preferably made of a thin steel, such as 12-gauge sheet steel, and is shown to include a plurality of corrugations 124, 126, 128. The corrugations are formed in a manner well known in the metal forming art such as, but not limited to, braking, stamping or roll-forming operations. The number of corrugations in the side panel 113 will depend in part on the desired depth of the shelf receiving cavity 120 and on the desired strength of the frame 111. The depth of the shelf receiving cavity 120 is substantially determined by the width of the panels 113, 114, 116, 118. The corrugation 124 is formed at a lesser height than the height of the corrugations 126, 128 in accordance with the manner of attachment of the shelves 39, as is described below.

The corrugation arrangement of FIG. 7 has planar portions 130 which are substantially unchanged from the characteristics of the flat sheet steel prior to forming the corrugations 124, 126, 128. A top flange 132 of each corrugation 124, 126, 128 is substantially parallel to the planar portions 130. The corrugation 124 has an outer-facing flange 134 that is substantially orthogonal to the planar portions 130, and an inner-facing flange 136 that slopes away from the outer-facing flange 134 in traversing from the top flange 132 to the planar portion 130. The corrugations 126, 128 can have substantially equilaterally sloping opposing flanges 138 forming a broader base adjacent the planar portions 130 than adjacent the corresponding top flange 132.

As illustrated in FIG. 7, the corrugations 124, 126 support the mounting bracket assembly 112. The mounting bracket assembly 112 includes a mounting bracket 202 and a mounting flange 204. The mounting bracket 202 and the mounting flange 204 of the mounting bracket assembly 112 are illustrated in FIG. 7 as being separate components that are joined together, (alternatively, a one-piece construction is discussed below and illustrated in FIG. 8).

Considering now both side panels 113, 114, the mounting bracket assemblies 112, 112a cooperate as opposing pairs, referred to herein as mounting bracket assembly sets, to support both ends of the shelves 39. One of the mounting bracket assemblies in a mounting bracket assembly set will be substantially the mirror image of the other mounting bracket assembly within that mounting bracket assembly set. Therefore, the construction and function of each mounting bracket assembly 112 and 112a is substantially the same in supporting opposing sides of the shelves 39. As such, the following discussion focuses on a detailed description of the mounting bracket assembly 112.

As noted, the arrangement of the corrugations 124, 126 of the side panel 113 is illustrative of one arrangement well suited for use in the present invention. The outer-facing flange 134 of the corrugation 124 is substantially orthogonal to the planar portion 130. The opposing flange 136 of the corrugation 124 is angled to form an obtuse angle with the adjacent planar portion 130. The top flange 132 of the corrugation 124 is substantially parallel to the planar portions 130, and joins the upstanding ends of the outer-facing flange 134 and the flange 136.

In similar fashion, the corrugation 126 has opposing flanges 138 that are substantially equilaterally angled to form obtuse angles relative to the respective adjacent planar portions 130. The top flange 132 of the corrugation 126 is substantially parallel to the planar portions 130 and joins the upstanding ends of the equilaterally angled flanges 138. Other corrugations contained in the side panel 113 can be similarly situated.

It is advantageous to attach the mounting bracket assembly 112 to portions of the corrugations 124, 126 in order to benefit from the relative structural strength imparted to the side panel 113 by the corrugations 124, 126. To this end, as best shown in FIG. 7, the mounting bracket 202 of the mounting bracket assembly 112 has a first end 210, a second end 212, and a medial portion 214 spanning therebetween; the medial portion 214 disposed substantially parallel to the planar portions 130 when the mounting bracket 202 is secured to the side panel 112. The first end 210 is angled relative to the medial portion 214 in order to be substantially parallel to the outer-facing flange 134 of the corrugation 124. Matingly aligned apertures (not separately denoted) are provided in the first end 210 and the outer-facing flange 134 for passage of a fastener 216 to join the first end 210 to the outer-facing flange 134.

The medial portion 214 of the mounting bracket 202 is of a selected length, as is determined by the spacing of the corrugations 124, 126, so as to position the second end 212 of the mounting bracket 202 adjacent the nearest flange 138 of the corrugation 126. The second end 212 of the mounting bracket 202 is angled relative to the medial portion 214 in order to be parallel to the flange 138 of the corrugation 126. Matingly aligned apertures (not separately denoted) are provided in the second end 212 and the flange 138 for passage of a fastener 216 to join the second end 212 to the flange 138. In this manner, the mounting bracket 202 is characteristically shaped to conform to the cross-sectional profile of the side panel 113 so that the ends 210, 212 are attached to flanges 134, 138 of corrugations 124, 126 in attaching the mounting bracket assembly 112 to the side panel 113.

The mounting flange 204 has a base 218 that is aligned with the medial portion 214 of the mounting bracket 202, and a support flange 220 extending substantially transversely from the base 218 into the shelf receiving cavity 120. In the mounting bracket assembly 112 of FIG. 7, the base 218 of the mounting flange 204 and the medial portion 214 of the mounting bracket 202 each have an aperture (not separately denoted) that is aligned for passage of a joining fastener, such as a rivet 222. Alternatively, FIG. 8 illustrates another mounting bracket assembly 112b which can be unitarily constructed by forming a support flange 220b as a formed portion of a medial portion 214b.

Returning to FIG. 7, the support flange 220 of the mounting flange 204 has a pattern of apertures 224 that is selected to matingly align with the apertures 46 (see FIG. 5) of the shelves 39 for passage of the fasteners 41 in attaching the shelves 39 to the mounting bracket assembly 112. When installed, the weight of the shelves 39 is thus operatively transferred through the mounting bracket assembly 112 to the side panel 113 of the frame 111.

The manner in which each aperture 224 in the mounting flange 204 cooperates with the fastener 41 in attaching the shelf 39 can be in accordance with any of a number of conventional methods of mechanical fastening, such as, but not limited to, riveting or threadingly joining the fastener 41 and aperture 224. In a threading engagement, the aperture 224 can be a clearance hole through which a threaded fastener passes and is retained by a capture nut (not shown) positioned on the opposing side of the support flange 220. Alternatively, the aperture 224 can be an engagement hole that is threaded or is appropriately sized for a thread-forming fastener.

FIG. 9 is a partial isometric view of the side panel 113 of the frame 111 with the mounting bracket assembly 112 attached thereto, showing the patterned apertures 224 along the support flange 220. The apertures 224 are substantially centered along a common vertical axis at preselected center-to-center spacings denoted by the reference numerals 226a, 226b, 226c.

The pattern of the mounting holes 46 in the desired shelf 39 defines the pattern of the apertures 224 in the support flange 220. It will be noted that in order to provide for a mating alignment, the mounting hole pattern of the shelf 39 must have the same spacing as, or an integer-multiple spacing of the hole pattern of the support flange 220. That is, for example, where both the shelf 39 and the support flange 220 have a ½ inch center-to-center spacing, the shelf 39 can be attached to the bracket assembly 220 because the hole patterns of the shelf 39 and the support flange 220 are the same, and thus there is a mating alignment therebetween. Likewise, where the support flange 220 has a ½ inch center-to-center spacing and the shelf 39 has a one-inch center-to-center spacing, the shelf 39 can also be attached to the bracket assembly 200 because the shelf pattern 39 is an integer-multiple of the support flange 220 pattern.

The mounting hole pattern is just one mounting characteristic of concern when providing a suitable mounting bracket assembly 112 for installing a desired shelf 39 in the enclosure 100. In addition to various mounting hole patterns, the width of commercially available shelves varies as well. FIG. 10 illustrates a mounting bracket assembly 300 having a mounting bracket 302 supported by the side panel 113 in the manner previously described. The mounting bracket 302 supports a mounting flange 304 between a first end 310 and a second end 312 of the mounting bracket 302. The mounting flange 304 has a support flange 320 with a pattern of apertures 324 for passage of the fasteners 41 in attaching one end of a shelf 39c to the mounting bracket assembly 300.

The support flange 320 is extended laterally relative to the mounting bracket 302 in order to position the apertures 324 in alignment with the mounting hole pattern of the shelf 39c, which has a width less than the shelf 39 of FIG. 7. In this manner of extending the support flange 320 inwardly to provide the mounting bracket assembly 300 with a suitable lateral position of the apertures 324, shelves of different widths, as well as different mounting hole patterns, can be installed in the frame 111.

It may be advantageous, as well, to vary the installed depth of the attaching flange 45 of the shelf 39 within the cavity 120. It will be noted from FIG. 10, for example, that the mounting flange 304 can be located at various positions between the first end 310 and the second end 312 of the mounting bracket 302 (an alternative position shown in broken lines). The support flange 320 has an abutting surface 328 that abuttingly engages the attaching flange 45 of the shelf 39 in the attachment of the shelf 39 to the mounting bracket assembly 300. By selectively locating the mounting flange 304 in the attachment thereof to the medial portion 314 between the first and second ends 310, 312, the installed depth of the attaching flange 45 and, in turn, of the shelf 39 can be varied.

Returning to FIG. 7 and summarizing, the side panel 113 supports the mounting bracket assembly 112 which, in turn, provides the pattern of apertures 224 that is alignable with mounting holes of the shelves 39 for attaching the shelves 39 to the enclosure 110. The mounting bracket assembly 112 is attached to the side panel 113 by fasteners 216. Preferably, the fasteners 216 are removable and replaceable so that an existing mounting bracket assembly 112 can be removed and replaced with a characteristically different mounting bracket assembly that aligns with the mounting characteristics of a desired shelf. The mounting characteristics of concern include the mounting hole pattern of the shelf, the lateral width separating the mounting hole patterns at opposing ends of the shelf, and the depth at which the shelf is to be installed in the enclosure 110.

It is possible, if desired, to use an individual bracket assembly set in supporting each shelf 39. Adjacent shelves independently supported in this manner by separate bracket assembly sets can have different mounting characteristics and be installed simultaneously in the enclosure 110. That is, two shelves of different mounting hole patterns can simultaneously be installed, because the mounting characteristics of the shelves are accommodated by the replaceable mounting bracket assemblies. Likewise, shelves having different widths and shelves installed at different depths can simultaneously be installed into the frame 111 by providing the appropriate mounting bracket assembly set.

Alternatively, the mounting bracket assemblies 112 can be longitudinally extended to support more than one shelf 39. The enclosure 110 of FIG. 6 shows two bracket assemblies 112 spanning the upstanding side panel 113 end-to-end, separated by a gap 230. This arrangement permits replacing one mounting bracket assembly set without affecting any shelves supported by the other mounting bracket assembly set. For example, if replacement shelves with a different mounting hole pattern are to be installed in the lower portion of the frame 111, then only the lower mounting bracket assembly set would need to be replaced with a replacement mounting bracket assembly set to match the hole pattern of the replacement shelves. The shelves supported by the upper mounting bracket assembly set would not be affected in this case.

The foregoing description has detailed the construction of the present invention, wherein generally there is contemplated a modular frame (such as the frame 111) for supporting electronic equipment shelves (such as shelves 39) by mounting bracket assembly sets comprising pairs of mounting bracket assemblies (such as mounting bracket assemblies 112 and 112a); each mounting bracket assembly being removably interposed between the frame 111 of the enclosure 110 and one end of the shelf. The mounting bracket assembly 112 adaptively aligns with the mounting characteristics of the shelf, such as the width, the mounting hole pattern, and the depth of the installed shelf, and supports the shelf in the shelf receiving cavity 120 of the frame 111.

Referring now to FIG. 11, another corrugated side panel 113a constructed in accordance with the present invention which allows two shelves 39 to be installed back-to-back at substantially the same height between the upper panel 116 and lower panel 118 of the enclosure 110 is illustrated. To accommodate two shelves 39 in this manner, the side panel 113a can be relatively wider and can have additional corrugations such as the four such corrugations 124a, 125a, 126a, 128a. The supporting engagement of the shelves 39 is otherwise like that described hereinabove. This arrangement of two bracket assemblies 112 attached back-to-back can alternatively be used to support a single shelf 39 at two supporting locations, such as at the previously described attaching flange 45 and at another attaching portion of a shelf.

Having described the construction of the present invention, attention is now focused on the method of use. As discussed, a user will be concerned with at least three mounting characteristics of a desired shelf 39 that is to be installed in the enclosure 110: mounting hole pattern, width, and depth.

Referring again to FIG. 7, the pattern of apertures (denoted 44 in FIG. 5) in the shelf 39 defines the pattern of the apertures 224, 224a in the support flange 220, 220a of the mounting flange 204, 204a. The operative width (denoted 400 in FIG. 7) of the shelf 39 defines the lateral spacing between the apertures 224, 224a for attaching the mounting flange 45 to the support flange 220 and for attaching the mounting flange 45a to the support flange 220a. Hence, the length of each support flange 220, 220a is provided as necessary to accommodate the width 400 of the shelf 39. The desired depth of the attaching flange 45, 45a within the cavity 120 defines the location of the mounting flange 204, 204a between the respective first end 210, 210a and second end 212, 212a of the mounting bracket 202, 202a. The support flange 220, 220a of the mounting flange 204, 204a provides an abutting engagement with the attaching flange 45, 45a of the shelf 39, thereby determining the depth at which the shelf 39 is attached within the cavity 120.

The mounting bracket assembly 112 thus operatively interconnects shelves having preselected mounting characteristics to the frame 111 of the enclosure 110. In replacing an existing shelf, such as shelf 39 of FIG. 7, with a desired shelf, such as shelf 39c of FIG. 10, the user will detach the existing shelf 39 from the mounting bracket assembly 112 by removing the fasteners 41 of FIG. 7. The mounting bracket assembly 112 is then detached from the side panel 113 by removing the fasteners 216. The mounting bracket assembly 300 can then be attached to the side panel 113, for example, by installation of the fasteners 216 of FIG. 10. The desired shelf 39c is then attached to the bracket assembly 300 by installation of the fasteners 41.

It is to be understood that even though numerous characteristics and advantages of various embodiments of the present invention have been set forth in the foregoing description, together with details of the structure and function of various embodiments of the invention, this disclosure is illustrative only, and changes may be made in details especially in matters of structure and arrangement of parts within the principles of the present invention to the full extent indicated by the broad general meaning of the terms in which the appended claims are expressed.

What is claimed is:

1. An electronic equipment enclosure for supporting a plurality of shelves containing electronic equipment, each of the shelves having a first set of vertically spaced mounting holes on one end thereof and a second set of vertically spaced mounting holes on an opposing end, the electronic equipment enclosure comprising:

a frame having a bottom panel, a pair of parallel side panels, and a top panel connected together to define a shelf receiving cavity, the panels having grouped longitudinal flanges forming a plurality of corrugations for strengthening the frame, and each of the side panels having an interior side and an exterior side; and a first bracket assembly set for supporting a first shelf of the plurality of shelves, the first bracket assembly set comprising:

a first bracket assembly secured to the interior side of one of the side panels, the first bracket assembly including a mounting flange extending into the shelf receiving cavity, the mounting flange of the first bracket assembly having a plurality of vertically spaced apertures alignable with one of the first and second sets of the mounting holes of the first shelf to permit attachment of one end of the first shelf to the first bracket assembly; and a second bracket assembly secured to the interior side of the other side panel in an opposing relationship with respect to the first bracket assembly, the second bracket assembly including a mounting flange extending into the shelf receiving cavity, the mounting flange of the second bracket assembly having a plurality of vertically spaced apertures which are laterally spaced from the apertures of the mounting flange of the first bracket assembly to be alignable with the other set of the mounting holes of the first shelf to permit attachment of the other end of the first shelf to the second bracket assembly; and a second bracket assembly set for supporting a second shelf of the plurality of shelves, the second bracket assembly set comprising:

a third bracket assembly secured to the interior side of one of the side panels, the third bracket assembly including a mounting flange extending into the shelf receiving cavity, the mounting flange of the third bracket assembly having a plurality of vertically spaced apertures alignable with one of the first and second sets of the mounting holes of the second shelf to permit attachment of one end of the second shelf to the third bracket assembly; and a fourth bracket assembly secured to the interior side of the other side panel in an opposing relationship with respect to the third bracket assembly, the fourth bracket assembly including a mounting flange extending into the shelf receiving cavity, the mounting flange of the fourth bracket assembly having a plurality of vertically spaced apertures which are laterally spaced from the apertures of the mounting flange of the third bracket assembly to be alignable with the other set of the mounting holes of the second shelf to permit attachment of the other end of the second shelf to the fourth bracket assembly.

2. A bracket assembly set interposed between a frame of an electronic equipment enclosure and a shelf supported by the electronic equipment enclosure, wherein the shelf has a first set of spaced mounting holes on one end thereof and a second set of spaced mounting holes on an opposing end, the bracket assembly set comprising:

a first bracket assembly adaptively secured to the frame, the first bracket assembly including a mounting flange having a plurality of apertures alignable with one of the first and second sets of the mounting holes of the shelf to permit attachment of one end of the shelf to the first bracket assembly; and a second bracket assembly adaptively secured to the frame, the second bracket assembly including a mounting flange having a plurality of apertures laterally spaced relative to the apertures of the mounting flange of the first bracket assembly to be alignable with the other set of the mounting holes of the shelf to permit attachment of the other end of the shelf to the second bracket assembly.

3. A method of installing a plurality of electronic equipment shelves having various mounting characteristics in an electronic equipment enclosure, comprising the steps of:

determining the width of attaching portions of a first of the plurality of the shelves, each of the attaching portions of the first shelf having a mounting hole pattern;

determining the mounting hole pattern of the attaching portions of the first shelf;

determining the desired depth of the attaching portions of the first shelf in the enclosure;

providing a first mounting bracket assembly set with opposing mounting flanges to abuttingly engage and matingly align with the attaching portions of the first shelf;

attaching the first mounting bracket assembly set to the frame of the enclosure;

attaching the first shelf to the first mounting bracket assembly set;

determining the width of attaching portions of a second of the plurality of the shelves, each of the attaching portions of the second shelf having a mounting hole pattern;

determining the mounting hole pattern of the attaching portions of the second shelf;

determining the desired depth of the attaching portions of the second shelf in the enclosure;

providing a second mounting bracket assembly set with opposing mounting flanges to abuttingly engage and matingly align with the attaching portions of the second shelf;

attaching the second mounting bracket assembly set to the frame of the enclosure; and attaching the second shelf to the second mounting bracket assembly set.

4. An electronic equipment enclosure for simultaneously supporting a plurality of shelves having various mounting characteristics, the enclosure comprising:

a frame comprising opposing side panels disposed substantially in parallel relationship and separated by a top panel and a bottom panel, the panels defining a shelf receiving cavity;

a first bracket assembly set supported by the frame and adapted to support a first shelf having a first set of mounting holes on one end and a second set of mounting holes on an opposing end spaced a first distance from the first set of mounting holes; and a second bracket assembly set supported by the frame and adapted to support a second shelf having a first set of mounting holes on one end and a second set of mounting holes on an opposing end spaced a second distance from the first set of mounting holes which is different than the first distance of the first shelf.

5. An electronic equipment enclosure for simultaneously supporting a plurality of shelves having various mounting characteristics, the enclosure comprising:

a frame comprising opposing side panels disposed substantially in parallel relationship and separated by a top panel and a bottom panel, the panels defining a shelf receiving cavity; and a first bracket assembly set supported by the frame and adapted for supportingly engaging a first shelf having a first mounting characteristic; and a second bracket assembly set supported by the frame and adapted for supportingly engaging a second shelf having a different second mounting characteristic, wherein each of the first and second bracket assembly sets has an opposing pair of bracket assemblies with each bracket assembly having a mounting flange, the mounting flanges of the first bracket assembly set providing a supporting surface for attaching the first shelf at a first depth and the mounting flanges of the second bracket assembly set providing a supporting surface for attaching the second shelf at a second depth which is different from the first depth.

6. An electronic equipment enclosure for simultaneously supporting a plurality of shelves having various mounting characteristics, the enclosure comprising:

a frame comprising opposing side panels disposed substantially in parallel relationship and separated by a top panel and a bottom panel, the panels defining a shelf receiving cavity;

a first bracket assembly set supported by the frame and adapted for supportingly engaging a first shelf having a first mounting characteristic; and a second bracket assembly set supported by the frame and adapted for supportingly engaging a second shelf having a different second mounting characteristic, wherein the first bracket assembly set supportingly engages the first shelf at a selected height in the shelf receiving cavity, and wherein the second bracket assembly set supportingly engages the second shelf at substantially the same height as the first shelf and in a back-to-back relationship relative thereto.

7. The enclosure of claim 1 wherein the mounting flanges of the first bracket assembly set supportingly engage the first shelf at a first desired depth in the shelf receiving cavity and the mounting flanges of the second bracket assembly set supportingly engage the second shelf at a second desired depth in the shelf receiving cavity.

8. The enclosure of claim 7 wherein each bracket assembly further comprises a mounting bracket removably supported by one of the side panels, the mounting bracket supporting the respective mounting flange of the bracket assembly.

9. The enclosure of claim 8 wherein the mounting bracket has a first end removably attached to a flange of a first corrugation of the plurality of corrugations, a second end removably attached a flange of a second corrugation of the plurality of corrugations, and a medial portion spanning therebetween the first end and the second end.

10. The enclosure of claim 9 wherein the mounting flange is selectively disposed between the first and second ends of the mounting bracket in supporting the respective shelf at the desired depth within the shelf receiving cavity.

11. The enclosure of claim 9 wherein the mounting bracket conforms to the side panel in attaching thereto, the first end of the mounting bracket disposed substantially parallel to the flange of the first corrugation, the second end of the mounting bracket disposed substantially parallel relationship to the flange of the second corrugation, and wherein a fastener joins the first end to the flange of the first corrugation and another fastener joins the second end to the flange of the second corrugation.

12. The enclosure of claim 11 wherein the first bracket assembly set supports the first shelf at a desired height in the shelf receiving cavity, and the second bracket assembly set supports the second shelf at substantially the same desired height in the shelf receiving cavity and in a back-to-back relationship with the first shelf.

13. The enclosure of claim 1 wherein each of the side panels further comprises a plurality of substantially unformed planar portions between the plurality of corrugations, and wherein the plurality of corrugations comprises:
   a first corrugation, comprising:
      an outward facing flange disposed substantially orthogonal to and extending proximally from a first planar portion;
      an opposing flange disposed so as to form an obtuse angle with and extending proximally from a second planar portion; and
      a top flange disposed substantially parallel to the planar portions and joining a distal end of the outward facing flange and a distal end of the opposing flange; and
   a second corrugation, comprising:
      a first flange nearest the first corrugation disposed so as to form an obtuse angle with and extending proximally from the second planar portion;
      an opposing flange disposed so as to form an obtuse angle with and extending proximally from a third planar portion; and
      a top flange disposed substantially parallel to the planar portions and joining a distal end of the first flange and a distal end of the opposing flange.

14. The enclosure of claim 13, wherein the mounting flange is supported by a mounting bracket of the respective mounting bracket assembly, the mounting bracket comprising:
   a first end disposed substantially parallel to the outward facing flange of the first corrugation;
   a second end disposed substantially parallel to the first flange of the second corrugation; and
   a medial portion spanning therebetween the first end and the second end and disposed substantially parallel to the planar portions, wherein the medial portion supports the mounting flange.

15. The enclosure of claim 14 wherein the first end of the mounting bracket has an aperture and the outward facing flange of the first corrugation has an aperture matingly aligned with the first end aperture for a joining fastener to join the first end of the mounting bracket to the side panel, and wherein the second end has an aperture and the first flange of the second corrugation has an aperture matingly aligned with the second end aperture for another joining fastener to join the second end of the mounting bracket to the side panel.

16. The enclosure of claim 5 wherein each bracket assembly further comprises a mounting bracket removably attached to the side panels, and wherein the mounting flange depends from the mounting bracket.

17. The enclosure of claim 16 wherein the mounting bracket has a first end attached to the side panel by a fastening approach selected from the group consisting of a threaded fastener, a frictional fastener, crimping, and welding, and wherein each mounting bracket has a second end attached to the side panel by a fastening approach selected from the group consisting of a threaded fastener, a frictional fastener, crimping, and welding.

18. The enclosure of claim 17 wherein the mounting flange has an abutting surface extending substantially transversely from the mounting bracket, the abutting surface adapted to pressingly engage an attaching flange of one end of the shelf to define the depth of the installed end of the shelf within the shelf receiving cavity.

19. The enclosure of claim 18 wherein the mounting flange is selectively configured to place the abutting surface at a desired location between the first end and the second end of the mounting bracket in order to define the installed depth of the end of the shelf within the shelf receiving cavity.

20. The enclosure of claim 16 wherein the mounting flange has an aperture adapted to matingly align with a mounting hole of a selected shelf for passage of a fastener in joining the selected shelf to the mounting flange of the bracket assembly.

21. The enclosure of claim 17 wherein the side panel furthermore has grouped flanges forming a corrugation for stiffening the frame.

22. The enclosure of claim 21 wherein the side panel has a first corrugation supporting the first end of the mounting bracket, the side panel furthermore having a second corrugation supporting the second end of the mounting bracket.

23. The enclosure of claim 16 wherein the mounting flange is attached to the mounting bracket of the bracket assembly by a fastening approach selected from the group consisting of a threaded fastener, a frictional fastener, crimping, and welding.

24. The enclosure of claim 16 wherein the mounting flange is formed as a portion of the mounting bracket of the bracket assembly.

25. The bracket assembly set of claim 2 wherein the frame comprises a pair of upstanding panels having grouped longitudinal flanges forming a first corrugation and a second corrugation in each panel for strengthening the frame, wherein each bracket assembly comprises a mounting bracket supporting the respective mounting flange, the mounting bracket having a first end removably attached to the first corrugation and furthermore having a second end removably attached to the second corrugation.

* * * * *